(12) United States Patent
Kawashima

(10) Patent No.: US 6,293,849 B1
(45) Date of Patent: Sep. 25, 2001

(54) POLISHING SOLUTION SUPPLY SYSTEM

(75) Inventor: Kiyotaka Kawashima, Yokohama (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/181,993

(22) Filed: Oct. 29, 1998

(30) Foreign Application Priority Data

Oct. 31, 1997 (JP) .................................................. 9-316216
Oct. 31, 1997 (JP) .................................................. 9-316217

(51) Int. Cl.[7] ................................. B24C 1/00; B24B 1/00
(52) U.S. Cl. ................................. 451/41; 451/36; 451/60; 451/99; 451/287; 451/288
(58) Field of Search .............................. 451/41, 285–290, 451/36, 60, 99

(56) References Cited

U.S. PATENT DOCUMENTS

| | | | |
|---|---|---|---|
| 5,643,406 | * | 7/1997 | Shimomura et al. .................... 451/41 |
| 5,670,011 | * | 9/1997 | Togawa et al. .......................... 451/41 |
| 5,707,274 | * | 1/1998 | Kim et al. ............................... 451/41 |
| 5,716,264 | * | 2/1998 | Kimura et al. ........................ 451/443 |
| 5,738,574 | * | 4/1998 | Tolles et al. ............................ 451/41 |
| 5,762,537 | * | 6/1998 | Sandhu et al. .......................... 451/41 |
| 5,762,539 | * | 7/1998 | Nakashiba et al. ..................... 451/41 |
| 5,823,854 | * | 10/1998 | Chen ....................................... 451/41 |
| 5,885,134 | * | 3/1999 | Shibata et al. .......................... 451/41 |
| 5,906,532 | * | 5/1999 | Nakajima et al. ...................... 451/41 |
| 5,934,977 | * | 10/1999 | Marmillion et al. ................... 451/41 |

FOREIGN PATENT DOCUMENTS

| | | |
|---|---|---|
| 7-52045 | 2/1995 | (JP) . |
| 7-100738 | 4/1995 | (JP) . |
| 10-76153 | 3/1998 | (JP) . |

* cited by examiner

*Primary Examiner*—M. Rachuba
(74) *Attorney, Agent, or Firm*—Wenderoth, Lind & Ponack, L.L.P.

(57) ABSTRACT

A polishing solution supply system can prevent precipitation of solutes on delivery pipes or interior walls of holding tanks so that a polishing solution of a constant solution concentration can be supplied to a polishing tool. The polishing solution supply system includes a stock solution supply source, a dilution solution supply source, and a mixing section for mixing a stock solution and a dilution solution to formulate the polishing solution. The mixing section is sealed hermetically to exclude external atmosphere. Delivery lines deliver the polishing solution to each of plural polishing sections.

20 Claims, 7 Drawing Sheets

POLISHING SOLUTION SUPPLY SYSTEM

BACKGROUND OF THE INVENTION

1. Field of the Invention

The present invention relates in general to liquid flow devices used in apparatus for polishing semiconductor substrates, and relate in particular to a polishing solution supply system that supplies a polishing solution of a fixed concentration.

2. Description of the Related Art

In recent years, there has been a quantum leap in the density of integrated circuit devices, leading to a trend of narrower interline spacing. In, in the case of using optical photolithography, the shallow depth of focus associated with stepper optics demands extreme flatness at the focal plane.

A known method of obtaining a flat surface is to employ a polishing section (having a turntable and a polishing cloth, for example), and an object holding device for holding and pressing an object to be polished against the polishing cloth, so that polishing of the surface is achieved by sliding the object surface against the polishing cloth while supplying a polishing solution at the sliding interface. Such a polishing section produces mechanical polishing action as well as chemical polishing action by supplying an alkaline or acidic polishing solution.

In such a polishing section, variables for determining the rate of material removal from the surface (polishing rate) include not only the magnitude of the pressure against the polishing tool (e.g., polishing cloth) and the speed of relative sliding, but also the concentration of the polishing solution and the rate of supplying the solution. It is important to control the polishing rate to be constant, not only for controlling the effect of the polishing rate on the quality of the polished object but also for determining an endpoint so as to stop the polishing process properly, thereby to obtain improved productivity.

An example of such apparatus for supplying a polishing solution of a constant concentration is disclosed in Japanese Laid-Open Patent Publication, H7-52045. This apparatus comprises a stock solution tank, a first and a second solution adjusting tanks to adjust the concentration of the solution in two stages, and a circulation tank for supplying the adjusted solution to the polishing section or providing a circulating flow of the adjusted solution. Such solution storage tanks are normally high capacity tanks, ranging in capacities from 1~2 $m^3$, so as to enable charging a sufficient quantity of solution to last for one day of production.

The stock solution and diluted polishing solution in this prior apparatus are not the type to be affected by exposure to air so that, although the tanks are closed with lids, effort is not made to actively exclude outside air from flowing into the tanks.

However, such a design allows escape of the interior humid atmosphere to cause drying of the interior atmosphere. Since the liquid level inside the tanks fluctuates, when the liquid around the top periphery of the tank evaporates, solute is precipitated. Repetition of such of liquid level fluctuation and solute precipitation leads ultimately to growth of the precipitate on the interior surfaces of the tanks, which then breaks off and falls into the liquid to cause blocking of liquid outlet openings, resulting not only in disruptions in production but also in fluctuation of solution concentration during the polishing operation, as well as degradation of the polished surface due to the large precipitated particles included in the polishing solution.

Therefore, a first objective of the present invention is to prevent precipitation of solutes on delivery pipes or interior walls of holding tanks so that a polishing solution of a constant solution concentration can be supplied to a polishing tool.

As described hereinbefore, to produce high quality polished products using the polishing section, it is required to supply a polishing solution of a constant concentration at a steady flow rate. Polishing solution of a given concentration is prepared by mixing a stock solution with dilution solution in a mixing tank prior to its use, and the prepared polishing solution is delivered from the mixing tank to a solution supply nozzle of the polishing section through a solution delivery pipe. It is also required that, from the viewpoints of economizing capital and operating costs, one mixing tank be used for a plurality of polishing sections. This has been achieved by providing a main distribution line where a constant flow of the polishing solution is provided and delivery pipes branching off from the main distribution line where a constant-flow pump such as a roller-operated pump is provided to pump the solution to individual polishing sections. Such arrangement can shorten the length of liquid delivery piping as well as avoid precipitation of solute from the polishing solution associated with repeated stopping and starting of individual polishing sections.

However, there are problems with this type of solution delivery arrangement. First, although a roughly constant volume of polishing solution is delivered regardless of the variations in hydrostatic pressure in the main distribution line, it is not possible to eliminate changes in the flow rate caused by deformation of flexible tubing used for the roller pumps. Second, it is inevitable that such roller pumps produce some pulsations in flow rates. Third, because of the flexibility of the tube in the roller pump, deterioration of the tube is unavoidable with age, and it is not possible to assure long-term stability for the liquid delivery system.

Further problems in such a liquid delivery system are that the quality of polished products often suffers from the lack of steady supply of polishing solution of a constant concentration to individual an polishing unit caused by system deficiencies such as differences in lengths and diameters of the delivery pipes, and fluctuations in flow rates caused by the pressure changes in the delivery circuits resulting from changing numbers of operating and non-operating polishing sections.

An second objective is, therefore, to provide an economical polishing solution supply system which is able to supply a polishing solution of a constant solution concentration at a steady rate to a plurality of polishing sections, and to provide a functionality to each polishing section so that each polishing section itself is able to control its own rate of supply of a polishing solution of a constant concentration. Such an arrangement would also allow flexibly in changing, for example, the layout of polishing sections in a plant.

SUMMARY OF THE INVENTION

The first objective has been achieved in a polishing solution supply system for supplying a polishing solution to one or more polishing sections comprising: a stock solution supply source for containing a stock solution; a dilution solution supply source for containing a dilution solution; a mixing section for mixing the stock solution and the dilution solution supplied by way of a stock solution supply line and a dilution solution supply line to formulate the polishing solution, the mixing section being sealed hermetically to exclude external atmosphere; and one or more delivery lines to deliver the polishing solution to the polishing section.

Accordingly, hermetic sealing of the mixing section prevents the contents of the mixing section from being affected by external atmosphere, and suppresses solution drying and precipitation on the walls of the mixing section, and also prevents mutual reactions or contamination between the external atmosphere and the contents. The mixing section may be formed as merging solution supply lines or a hermetic container of a suitable shape. The mixing section functions as a buffer to absorb fluctuations in consumption of the polishing solution so long as the volumetric capacity of the mixing section is adequate.

The mixing section may constitute a part of a polishing solution circulation line. The circulation line is disposed to be proximal to each polishing section, and the solution is supplied through a delivery pipe, associated with each polishing section, which branches from the circulation line. By adopting such an arrangement, stagnation of the solution which stays between the mixing section and the polishing section can be prevented so that changes in solution concentration and line plugging due to precipitation can be prevented. By providing liquid level sensors inside the mixing section, it is possible to determine a residual amount of polishing solution so that the liquid level inside the mixing section can be maintained in a desirable range.

The mixing section may be provided with a pressure adjustment device for adjusting an internal pressure of liquid paths. Such a device may be an air bag which can expand or contract in response to changes in the liquid level inside the mixing section. In this case, the mixing section or air bag may be provided with a temperature control device so that condensation of moisture inside the air bag may be prevented.

Another aspect of the present invention is a polishing solution supply system for supplying a polishing solution to a polishing section comprising: a circulation line for circulating the polishing solution; and delivery lines to deliver the polishing solution to the polishing section, wherein the circulation line and the delivery lines are sealed hermetically to exclude external atmosphere. The terminal end of the delivery pipe is a polishing solution supply nozzle, and it is opened when needed, but when not in use, a shutoff valve is closed to seal off the pipe from the external atmosphere.

The solution supply system may be further provided with a stock solution tank, a dilution solution tank and a mixing section for mixing a stock solution and a dilution solution, and all liquid paths including solution tanks are hermetically sealed.

The solution supply system may be provided with a cleaning unit for cleaning a stock solution supply line for supplying the stock solution to the mixing section, and the mixing section is provided with an additive supply line to supply an additive to the polishing solution.

A level sensing signal is used to control the liquid level in the mixing section within a certain range by supplying the stock and dilution solutions in a suitable ratio. When the residual level is very low, a warning may be issued. The cleaning unit may be comprised by interconnecting piping connected between the stock solution supply line and dilution solution supply line so as to direct the dilution solution to the stock solution supply line and to drain the spent solution by operation of valves. The valves may be operated so as to switch the flow of the solutions between the two supply lines for alternate cleaning.

The solution supply system may be provided with flow rate adjustment devices for adjusting a flow rate of the stock solution and/or the dilution solution to the mixing section, and a control device to maintain a constant composition of a polishing solution in the mixing section by controlling the flow rate adjustment devices.

The solution supply system may have a flow adjustment device in a stock solution supply line communicating with a dilution solution supply line, and a flow adjustment device in a dilution solution supply line communicating with a stock solution supply line. A liquid switching device may be provided to switch between the stock solution and the dilution solution.

Another aspect of the invention is a polishing solution supply system for supplying a polishing solution to a polishing section, comprising: a mixing section for adjusting a concentration and/or constituents of the polishing solution, and a flow control device for controlling a rate of supplying a liquid to the mixing section, the flow adjustment device comprising a pressure adjustment valve for adjusting a liquid pressure at a secondary-side thereof. Thus, the secondary-side liquid pressure (output pressure) of the pressure adjustment valve can be controlled according to a signal from the flow control device, and in combination with a constriction provided within or by a downstream piping, the pressure adjustment valve can control the flow rate of the polishing solution.

Another aspect of the invention is a polishing system comprising: a unitized housing including a polishing section for polishing an object by pressing the object against a polishing tool, and a delivery line communicating with an external polishing solution supply source for supplying a polishing solution to the polishing section, wherein the delivery line is provided with a flow rate control device for controlling flow of the polishing solution at a desired flow rate given by a command signal, and a shutoff valve for stopping inflow of the polishing solution.

Accordingly, regardless of the conditions in the external supply source of polishing solution, for example some pressure fluctuations, the flow rate control device maintains a constant rate of supply of polishing solution to the polishing section to provide a highly practical unitized polishing system.

The delivery line may be comprised by an extended circulation line to constitute a part of a trunk line for flowing the polishing solution, and a delivery pipe extending from the extended circulation line towards the polishing section.

Accordingly, the polishing solution is always circulating in the trunk line so that, even when the polishing section is not operating, the polishing solution does not stagnate in the trunk line, thereby preventing solute precipitation from the solution to cause compositional fluctuations and plugging in the line. Therefore, the delivery pipe which is vulnerable to stagnation can be of short length to promote steady flow of polishing solution. The trunk line can be used as the circulation line, which may be provided with a buffer tank to moderate any effects introduced by changes in solution flow rates. The circulation line may be provided with various sensors such as pressure sensor and a flow control device to control a circulation pump to minimize pressure fluctuations.

The flow control device may have a pressure adjustment valve for adjusting a pressure in a secondary-side of the flow control device at a specific value given by the command signal. Accordingly, when the secondary-side pressure is kept at a certain value, the flow rate in all the liquid paths can be kept at a constant value. A constriction device such as a flow control orifice may be provided downstream in the liquid circulation line, as necessary, and an electro-pneumatic device may be provided to generate a command signal to convert pilot air pressure to a liquid pressure for flow rate control purposes.

The delivery pipe may be communicated with a cleaning liquid delivery pipe for supplying a cleaning solution through the flow control device. Accordingly, the flow control device can be operated at its optimum performance. Cleaning solution may be a constituent of the polishing solution such as deionized water or other substances compatible with polishing process.

Another aspect of the invention is a polishing solution supply system for supplying a polishing solution to one or more polishing sections, comprising: a trunk line for continuously flowing the polishing solution, and a delivery lines extending from the trunk line towards the respective polishing sections, wherein each delivery line is provided with a flow control device for controlling a flow rate of the polishing solution by adjusting valving according to a command signal.

Another aspect is a method for polishing a semiconductor wafer using a polishing system comprising one or more polishing sections; a polishing solution supply system for supplying a polishing solution to each polishing section; a polishing solution circulation path interposed between the polishing section and the polishing solution supply system; and delivery lines extending from the polishing solution circulation path to each of the polishing sections; comprising the steps of: diluting a solution to a desired concentration to formulate the polishing solution; circulating the polishing solution within the polishing solution circulation path; withdrawing and forwarding the polishing solution from the polishing solution circulation path forwarding to the individual polishing sections; adjusting valving of a flow valve in each delivery line to a pre-determined flow rate given by a command signal so as to deliver a desired quantity of the polishing solution to individual polishing sections; and stopping withdrawing of the polishing solution from the polishing solution circulation path to a polishing section and cleaning the respective delivery line.

The step of adjusting valving may be performed by balancing a pressure in a secondary-side of the flow valve against a pre-determined pressure signal to correspond with a desired flow rate for a respective polishing section.

DETAILED DESCRIPTION OF THE PREFERRED EMBODIMENTS

Figure 1:
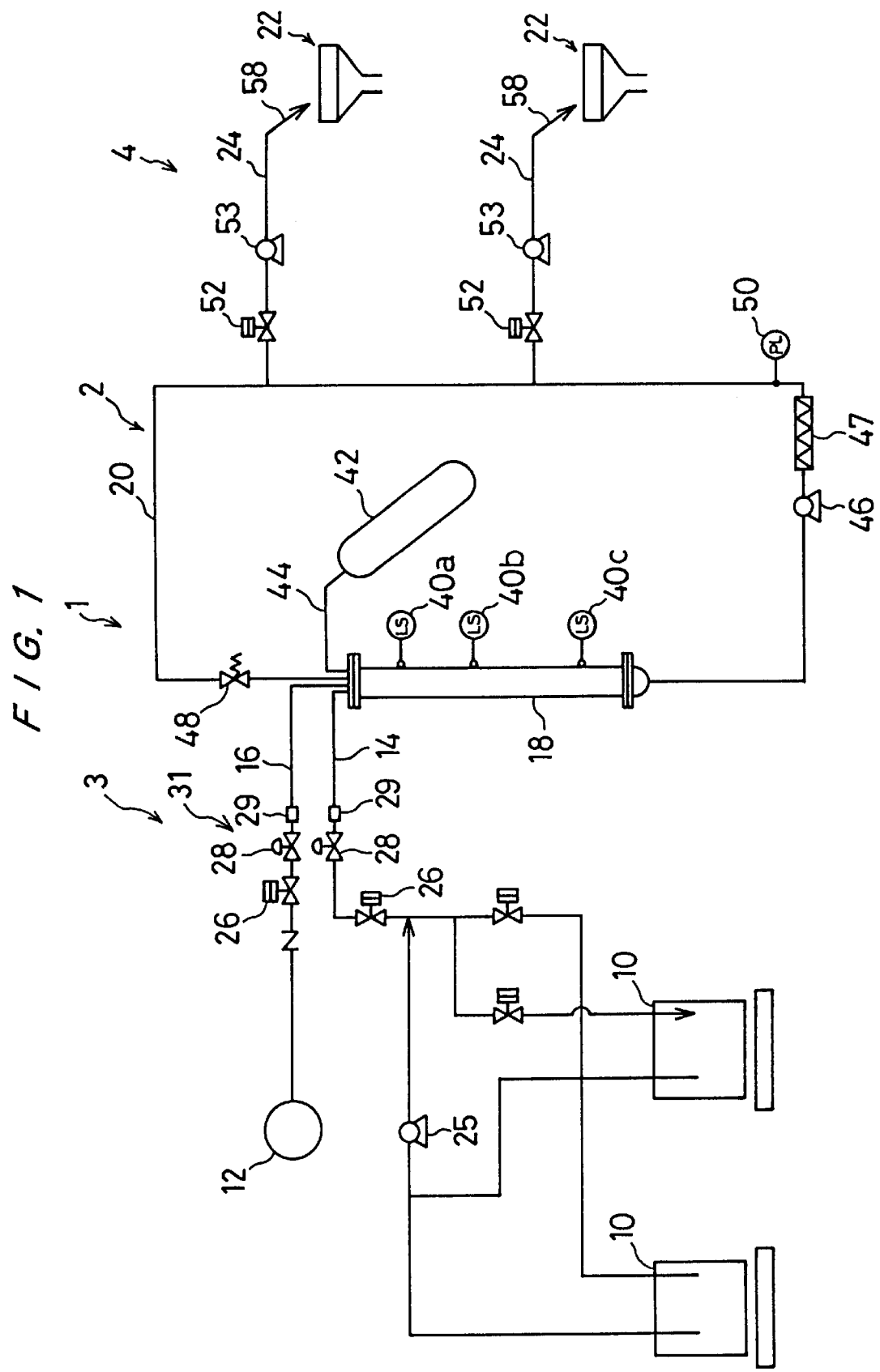
FIG. 1 is a schematic overall layout of a first embodiment of the polishing system including the solution supply system of the present invention.

Preferred embodiments will be presented in the following with reference to the drawings. As shown in FIG. 1, the polishing system 1 comprises: a polishing solution supply system 3 for preparing a polishing solution of a given composition by mixing a stock solution with a dilution solution and supplying it by way of a circulation path 2; and a polishing section 4 for polishing an object using a polishing tool. The polishing solution supply system 3 has two sources of liquid supply i.e, two stock solution sources (tank) 10 for storing a stock solution and a dilution solution source 12 for storing a dilution solution for diluting the stock solution to formulate a polishing solution of a desired concentration. The system 1 further comprises a mixing section 18 provided in the circulation path 2 for merging the two liquids supplied from the two liquid sources 10, 12 through solution supply lines 14, 16; solution delivery pipes 24 for supplying the polishing solution to individual polishing units 22.

Stock solution for the polishing solution may be an acidic, alkaline or neutral solution containing abrading particles such as silica gel of a certain particle size, and is selected according to the type of object to be polished. The dilution solution is normally pure deionized water. In this example, the stock solution is contained in stock solution tanks 10, and when one tank becomes empty, the stock solution supply line 14 can be switched from one stock solution tank 10 to another stock solution tank 10. Stock solution supply line 14 and dilution solution supply line 16 are each provided with a shutoff valve 26, a pressure adjustment valve 28 and a flow controlling orifice 29. This combination of the pressure adjustment valve 28 and the flow controlling orifice 29 constitutes a pressure compensated flow control valve 31.

Figure 3:
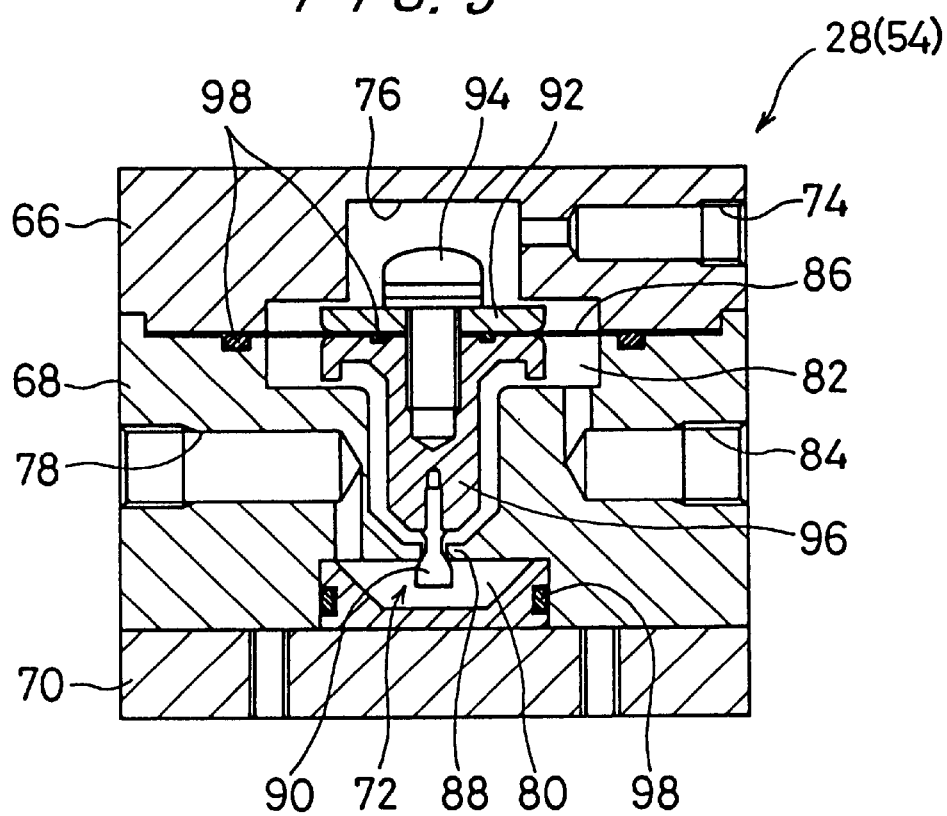
FIG. 3 is a detailed cross sectional view of a pressure adjustment valve shown in FIG. 1.

As shown in FIG. 3, the pressure adjustment valve 28 comprises a casing structure including an upper casing 66, a lower casing 68 and a bottom plate 70; and a valving device 72 housed in the casing structure. In more detail, the upper casing 66 includes an air pressure chamber 76 having an air pressure inlet 74 which is connected to a pilot air source (not shown). The lower casing 68 includes solution passages comprising a solution inlet path 78, a primary valve chamber 80, a secondary valve chamber (liquid pressure chamber) 82 and a solution outlet 84. A diaphragm 86 is clamped between the upper casing 66 and the lower casing 68 at the periphery to separate the air pressure chamber 76 from the secondary valve chamber 82.

A valve seat 88 is formed between the primary and secondary valve chambers 80, 82, and a valve body 90 is inserted therein from the bottom. The valve body 90 is attached to a valve rod 96 which is fixed to the diaphragm 86 by means of a retaining plate 92 and a bolt 94 so as to be movable along the axis of rod 96. Pressure adjustment valve 28 is provided with O-rings 98 at certain necessary locations.

The pressure adjustment valve 28 of such a construction can precisely control the quantity of stock solution or dilution solution to be supplied to buffer tube (mixing section) 18. The operation of the valve 28 is as follows. A controller (not shown) outputs a flow rate control signal to correspond to a pre-determined desired flow rate to an electro-pneumatic conversion unit of each pilot air source. The conversion unit provides a given pilot air pressure to the air pressure chamber 76 of the respective pressure adjustment valve 28, according to the flow rate control signal. In response to the input signal to the valve 28, a liquid introduced from the solution inlet path 78 passes through primary valve chamber 80 and the opening between the valve body 90 and valve seat 88, and flows into the liquid pressure chamber 82. The flow rate of the liquid flowing through the orifice 29 is univocally determined by the pressure inside the liquid pressure chamber 82 (secondary-side pressure). Therefore, by controlling the pressure inside the liquid pressure chamber 82 (secondary-side pressure) at a given value, the flow rate of the polishing solution is controlled at a desired value.

The following explains how a constant flow rate of the liquid flowing through the liquid outlet path 84 can be maintained by controlling the pressure in the liquid pressure chamber 82. The pilot air pressure in the air pressure chamber 76 and the liquid pressure in the liquid pressure chamber 82 are balanced through the diaphragm 86, and the liquid flows out of the liquid outlet path 84 at a desired flow rate. If the liquid pressure in the liquid pressure chamber 82 becomes higher for any reason, the valve rod 96 and valve body 90 are pushed upwards, and the liquid flow opening formed between the valve seat 88 and the valve body 90 becomes narrower, thus increasing the flow resistance so that the polishing liquid pressure in the liquid pressure chamber 82 is restored instantly to the desired pressure (a pressure balancing the pilot air pressure in the air pressure chamber 76). If the pressure in the liquid pressure chamber 82 drops, an opposite action takes place to restore the desired pressure. The result is that the amplitude and frequency of fluctuation in the liquid pressure are decreased, and the liquids can be supplied steadily to the mixing section 18 at respective flow rates determined by the respective pilot air pressures and the flow resistance provided in the downstream piping of solution supply lines 14, 16.

The orifice 29 provided downstream of the pressure adjustment valve 28 is used to determine the control range obtainable by changing the pilot air pressure. By providing an orifice 29 to suit the desired flow rate, the ratio between the stock solution and the dilution solution can be changed freely over a wide range. If the dimensions of the solution supply lines 14, 16 are such that they can function as suitable constrictions, there is no need for providing separate orifice 29. By providing the flow control valve 31 utilizing the pressure adjustment valve 28 of such a design in the stock solution supply line 14 as well as in the dilution solution supply line 16, flow rates of each solution can be controlled precisely so that a polishing solution of a desired composition can be formulated and maintained precisely at a desired level of concentration.

Figure 2:
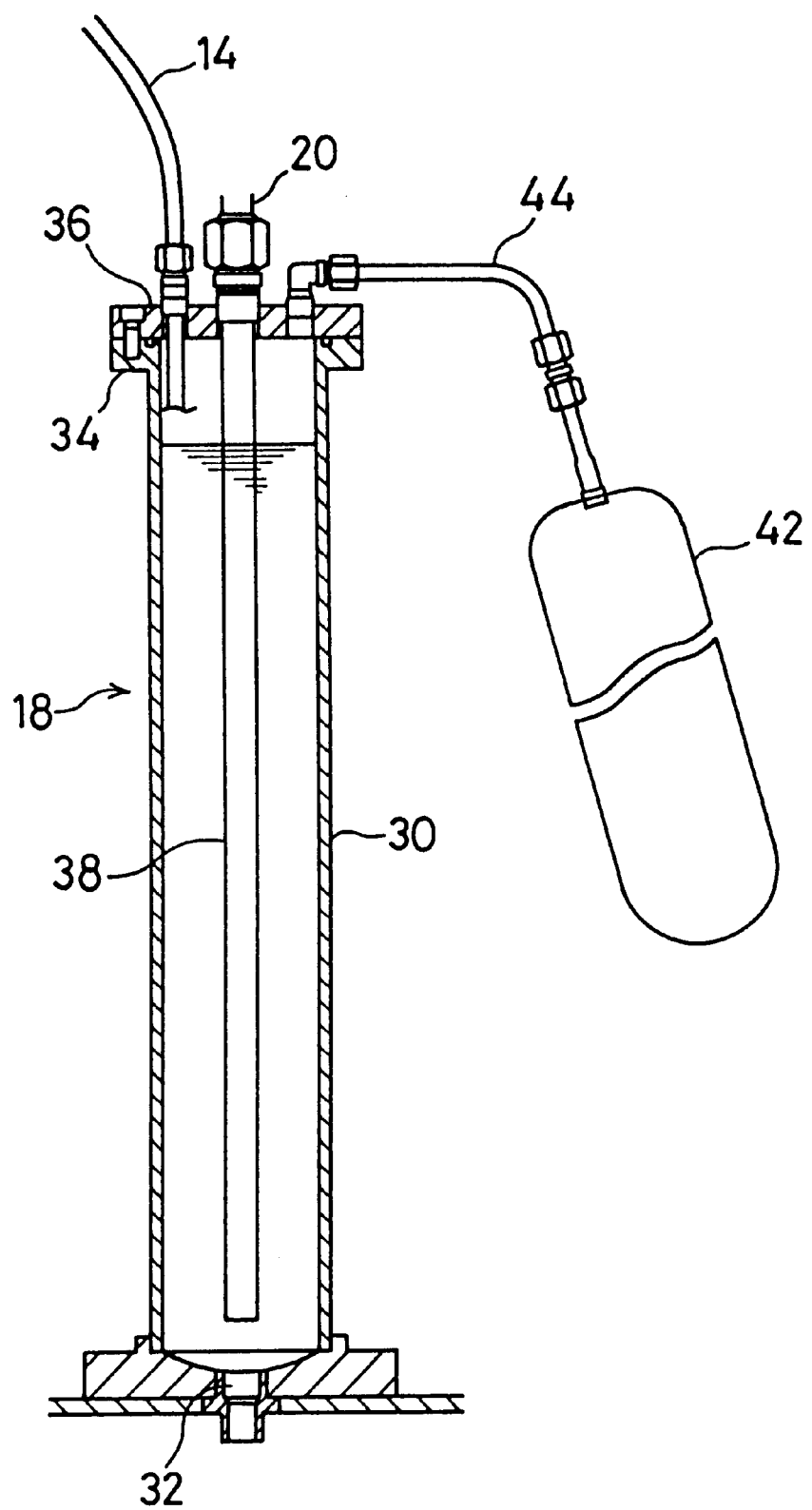
FIG. 2 is a cross sectional view of a buffer tube in FIG. 1.

The buffer tube 18, which functions as the mixing section, is provided within the circulation path 2 for supplying a polishing solution of a constant solution concentration to a plurality of polishing facilities. As shown in more detail in FIG. 2, the buffer tube 18 comprises a vertically-disposed cylindrical container 30 having a diameter larger than that of circulation pipe 20 of the circulation path 2. Container 30 is provided with a discharge opening 32 at the bottom. A cover 36 closes the top section of the container 30 by way of an O-ring 34. A return tube 38 in the return circuit of the circulation pipe 20 is inserted through the cover 36 to reach near the bottom of the container 30, pipes of the stock solution supply line 14 and the dilution solution supply line 16 (not illustrated) are inserted to extend midway into the container 30. It is desirable that the volumetric capacity of the buffer tube 18 does not exceed the volume of the polishing solution which can be used in a 24-hour period. This is to avoid possible degradation of the polishing solution by prolonged storage.

The container 30 is provided with level sensors 40*a*, 40*b* and 40*c* for detecting upper, lower and lowermost levels, for example, and output respective signals to a controller (not shown). In this embodiment, static capacitance type level sensors are used. The controller outputs control signals to shutoff valves 26 or pump 25 in the stock solution and dilution solution supply lines so that the stock solution and the dilution solution will be supplied when the liquid level reaches the lower level and the supply will be stopped when the liquid level reaches the upper level. If the liquid level should reach the lowermost level, the controller generates a warning signal or a stop signal for the polishing unit 22.

A flexible air bag 42 made of a flexible material is provided beside the container 30, and an air flow pipe 44 is provided on the lid 36 so as to communicate the air bag 42 with the container 30. Air bag 42 suppresses fluctuations of the internal air pressure caused by changes in the liquid level inside the container 30 while enabling the container 30 to be hermetically sealed. It is made of a flexible and durable material such as Teflon (trade name for poly-tetrafluoro ethylene) and is made sufficiently large to respond to changes in the liquid level. It should be noted that, if the temperature of the air bag 42 is lower than the temperature inside the container 30, moisture condenses inside the air bag 42. Therefore, if there is a possibility of generating a temperature difference, it is desirable that either or both of the container 30 and the air bag 42 be provided with temperature control means such as a cooling jacket for the container 30, for example. Temperature sensors may be provided also for the purpose of temperature control thereof. The solution supply lines 14, 16 and 20, and the container 30 are coupled by use of sealing elements such as sealing tapes so that hermetic sealing is maintained throughout. An inactive gas supply source may be preferably provided with the buffer tube 18 or the air bag 42 for introducing inactive gas such as high purity nitrogen gas into the air bag 42 and the buffer tube 18 prior to use of the polishing solution supply system so as to prevent deterioration of the polishing solution within the buffer tube 18.

Circulation pipe 20 is constructed to exit from the discharge opening 32 at the bottom of the buffer tube 18, travel near one or more polishing units 22 which are to be supplied with polishing solution, and returns to and is connected to the buffer tube 18 through the return pipe 38. Circulation pipe 20 is provided with a circulation pump 46 for circulating the polishing solution, a back pressure valve 48 for maintaining the internal pressure in the circulation pipe 20 above a certain value, and a pressure sensor 50 and the like. An in-line mixer 47 may be provided in the pipe 20 on the discharge-side of the circulation pump 46. The output signal from the pressure sensor 50 is input into and monitored by the controller. The controller may control the operation of the circulation pump 46 according to the output signals so as to maintain the internal pressure in the circulation pipe 20 at a constant value. Normally, circulation pump 46 is operated under a given condition, and the internal pipe pressure is maintained at a constant value by the back pressure valve 48. Circulation pipe 20 is branched into delivery pipes 24 in proximity of each polishing unit 22 to deliver the polishing solution, and each delivery pipe 24 is connected, through a shutoff valve 52 and an adjustable flow pump 53, to a polishing solution supply nozzle 58 directed at a certain location of each polishing unit 22.

Accordingly, by constantly circulating the polishing solution inside the piping to guide the solution to the neighborhood of the polishing unit 22, changes in solution concentration caused by stagnation inside the piping and line plugging caused by precipitated solid substances can be eliminated. Also, because the arrangement of the solution supply system permits the use of a long length of circulation piping, one supply source (mixing section) 18 can be used to supply a polishing solution, in a stable condition, to a plurality of polishing units 22 which may be located some distance away from the supply source. The cost of the overall facility can be reduced because of the small installation space required. Because each polishing unit 22 has its own operational schedule to be stopped, the polishing solution may become stagnant in some delivery pipes 24, but any adverse effects can be totally negated by flowing a small quantity of polishing solution sufficient to replace the stagnant liquid in the delivery pipes 24 before re-starting the polishing units 22.

The polishing solution supply system is hermetically designed so that the circulation path 2 including the mixing section 18 as well as the delivery pipes 24, excepting openings of polishing solution supply nozzles 58, is isolated from outside air. This promotes a stable environment in the piping circuit, including the buffer tube 18, such that the vapor pressure of the polishing solution within the piping circuit is relatively close to the saturation vapor pressure, thus preventing problems such as precipitation of solid substances on the internal surfaces caused by evaporation. In this example, stock solution supply line 14 including the stock solution tanks 10, and the dilution solution supply line 16 including the dilution tank 12 for storing dilution solution such as deionized water are also hermetically sealed to prevent precipitation attachment due to drying as well as the adverse effect of oxidation of the solutions.

Also, when the liquid level in the mixing section 18 becomes low, the stock solution and dilution solution are added, as necessary, to replenish a polishing solution of a desired composition, which is constantly kept in circulation within the circulation path 2. Therefore, a relatively small size of the mixing section 18 for adjustment of concentration is sufficient to maintain the quality of the polishing solution. For example, a 5-L(liter) capacity mixing section 18 is sufficient to feed three polishing units from one polishing solution supply source, and a 40-L capacity is sufficient to feed thirty polishing units.

In the following, the operation of the polishing solution supply system constructed as above will be presented. The controller controls the circulation pump 46 so as to maintain the outlet-side pressure higher than a specific pressure, thereby maintaining a constant flow of polishing solution within the circulation path 2. As individual polishing units 22 become operative, a portion of the polishing solution flows from its delivery pipe 24 into polishing solution supply nozzle 58 of the respective polishing unit 22. When the liquid level in the buffer tube 18 becomes lower than the lower limit, the controller opens the shutoff valve 26 and operates the pump 25 based on the signal from the level sensor 40b. Next, the controller outputs flow rate command signals to control the flow rates of stock solution and dilution solution by activating the pressure adjustment valves 28. The stock solutions and dilution solutions are thus introduced at a certain ratio into the buffer tube 18 until the liquid level reaches the upper limit. The two solutions are mixed in the mixing section 18. If it is difficult to mix thoroughly the polishing solution in the mixing section 18 alone, the polishing solution is subjected to further mixing in an in-line mixer 47 provided in some part of the circulation pipe 20 while being circulated therein.

Therefore, although the liquid level in the buffer tube 18 may go up and down, the air bag 42 expands or contracts accordingly, so that the internal pressure of the container 30 in the buffer tube 18 can be kept relatively constant and the operation of the circulation pump 46 is not adversely affected. Also, because the container 30 is sealed tightly, vapor does not escape out of the container 30, thus maintaining the internal vapor pressure close to its saturation pressure, and preventing drying of the polishing solution at the wall surfaces of the container 30. Therefore, solute precipitation on the wall surfaces of the supply source does not occur, thereby preventing unstable polishing operation caused by plugging of pipes and adverse effects produced by changes in the concentration of the polishing solution.

Figure 4:
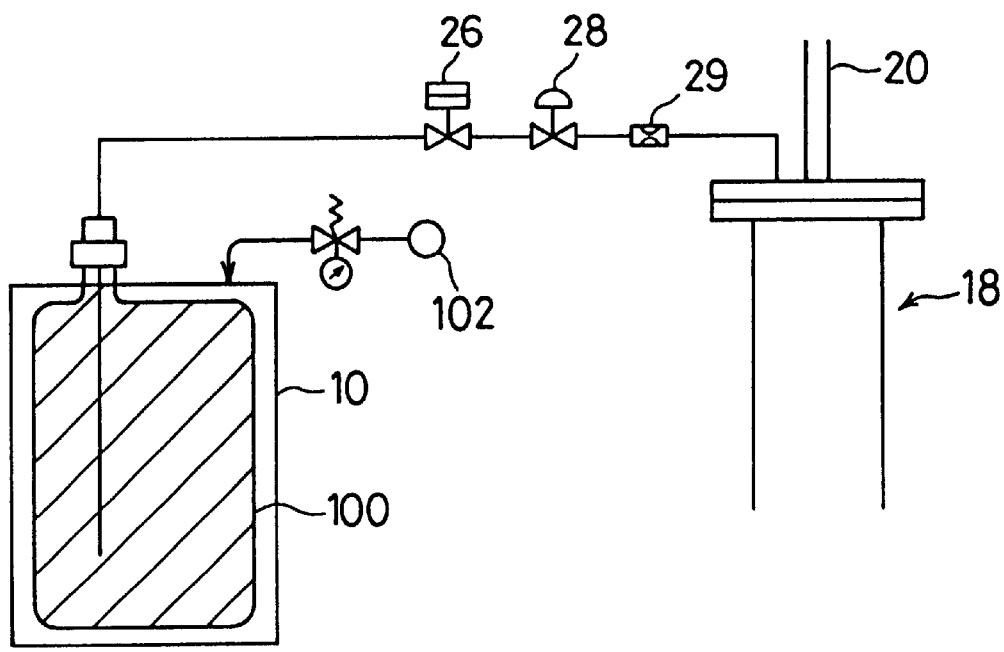
FIG. 4 is a cross sectional view of a variation of stock solution tank.

Stock solution tanks 10 and dilution solution tank 12 may also be provided with air bags similar to air bag 42 for the buffer tube 18 to avoid generation of a negative internal pressure produced by changes in the liquid level. Also, as shown in FIG. 4, an expandable container (bag) 100 made of a material such as Teflon (trade name) may be provided inside the stock solution tank 10 or the dilution solution tank 12. In this case, the solution inside the tank 10 can be forwarded to the buffer tube 18 without coming into contact with air, by pressurizing the space between the inside surface of the tank 10 and the container 100 with air from a pressurized air source 102.

Figure 5:
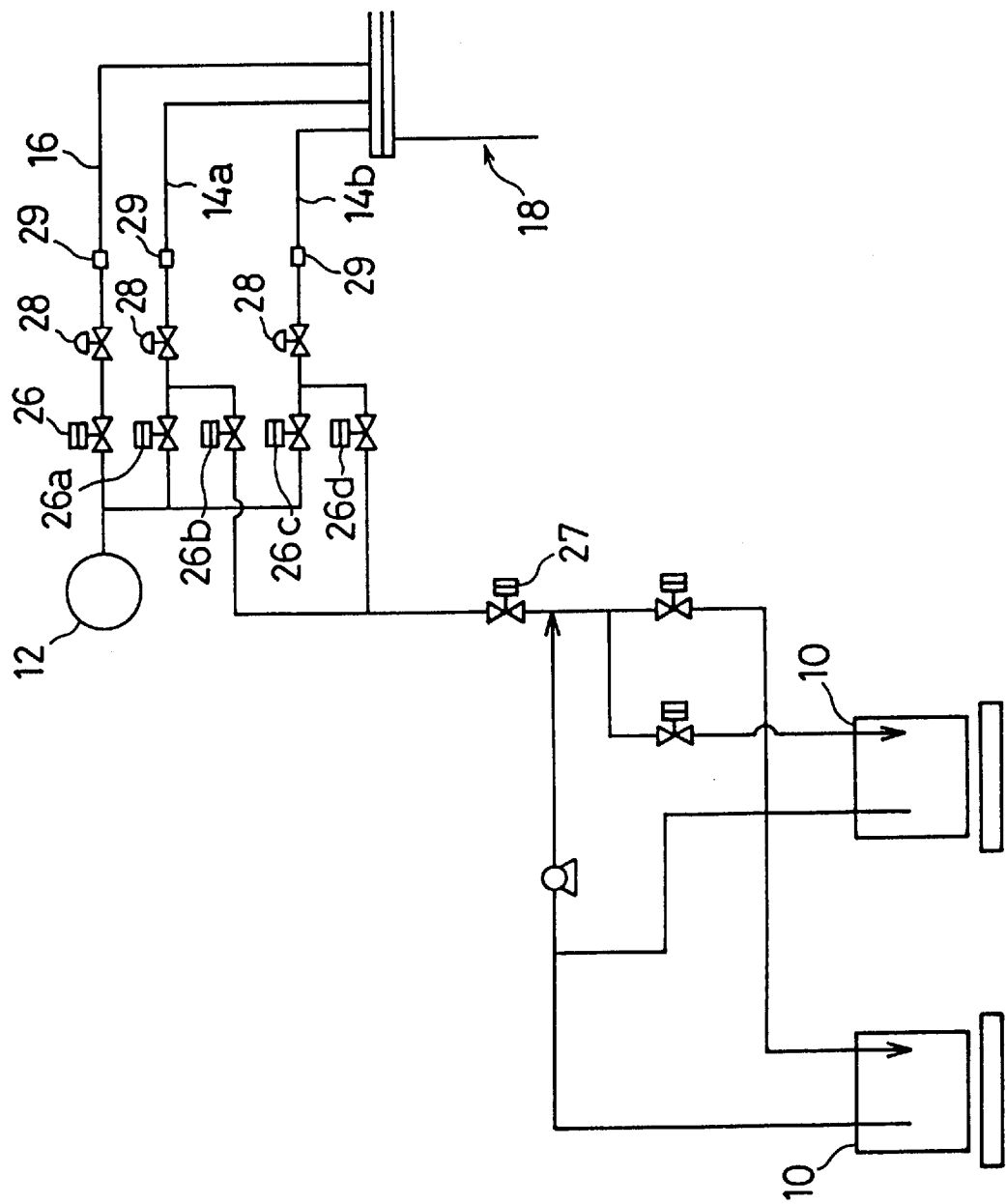
FIG. 5 is a schematic layout of another variation of the solution supply system.

The solution supply line 14 in the above embodiment can be cleaned using a fine flushing unit shown in FIG. 5. The flushing unit comprises switching valves 26a, 26b, 26c and 26d to switch supply between lines 14a, 14b to alternately supply a stock solution or a dilution solution to prevent plugging of the lines.

In this arrangement, according to the signals from the level sensor 40b in the buffer tube 18, valves 26, 26a are opened to supply dilution solution at a given flow rate through the dilution solution supply line 16 and the stock solution supply line 14a, and concurrently, valve 26d is opened to supply stock solution at a given flow rate through the stock solution supply line 14b. According to the signals from the level sensor 40a in the buffer tube 18, valves 26, 26a, 26d are closed simultaneously. Next, when the polishing solution is consumed by the polishing units 22, and the liquid level reaches the level sensor 40b, valves 26, 26c are opened, and the dilution solution is supplied through the line 16 and line 14b while the stock solution is supplied by opening the valve 26b through line 14a at given flow rates as mentioned above. This procedure not only provides adjustment of the concentration level of the polishing solution, but also performs cleaning of the stock solution supply lines 14a, 14b. Here, the dilution solution supply line 16 is used only for distribution of dilution solution, but may also be used a stock solution supply line by connecting stock supply pipes as in the case of connecting lines 14a, 14b.

Also, in the above embodiment, stock solution and dilution solution are mixed in the mixing section 18, but the supply system is capable of handling additional types of solutions. For example, a separate fluid circuit may be provided so that one! or more additives such as an oxidizing agent and a surface activation agent can be added in the mixing section 18, so that more than three kinds of solution can be mixed in the mixing section 18. As in the case of alternate supply of stock and dilution solutions described above, an additive solution can also be alternated with the dilution solution using one supply pipe.

Also, in the above embodiment, polishing solutions for polishing wafers are mixed, but cleaning solutions and the like may also be mixed in the same arrangement for cleaning polished wafers. For example, one or more of a surface activation agent, a dispension agent, acidic or alkaline etching solutions may be mixed together with a dilution solution in the mixing section 18. Such a mixed cleaning solution may be supplied onto a polishing cloth to clean or treat the polished surface of wafers. The same arrangement of piping and mixing section can also be used in a cleaning facility for mixing cleaning agents which are necessary to be mixed before use and supplying a cleaning solution mixture to a cleaning section of a cleaning facility.

Figure 6:
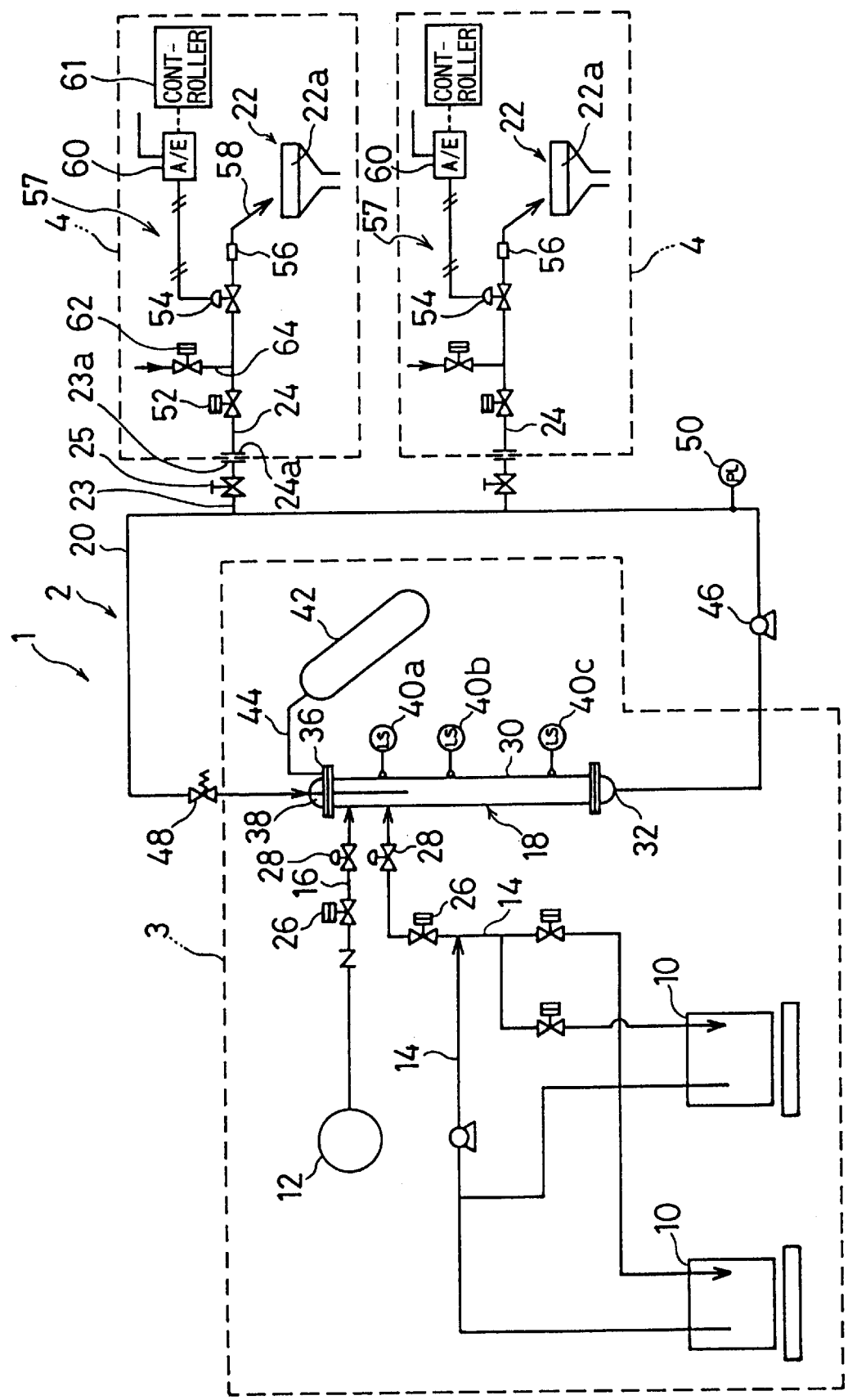
FIG. 6 is a schematic layout of a second embodiment of the polishing system of the present invention.

A second embodiment of the polishing system 1 is shown in FIG. 6. The system comprises a polishing solution supply system 3 and plural polishing sections 4 for objects with polishing tools. The structure of the solution supply system 3 is the same as that in the first embodiment shown in FIG. 1.

In this system, the circulation pipe 20 has branch lines 23 which branch near respective polishing sections. Each line 23 has a shutoff valve 25 and a coupling flange 23a which is connected to a flange 24a of the delivery pipe 24 of the polishing section 4. The delivery pipe 24 is provided with, from the upstream-side, a shutoff valve 52, a pressure adjustment valve 54 for maintaining the pressure in the secondary-side (downstream) constant, and an orifice 56, and is connected to the polishing solution supply nozzle 58 on the downstream-side of the orifice 56. Pressure adjustment valve 54 and the downstream-side orifice 56 form a flow rate control valve 57.

Pressure adjustment valve 54 is connected to an electro-pneumatic converter 60 for supplying a constant air pressure to correspond with a constant signal from a controller 61. The construction of the pressure adjustment valve 54 is the same as the one shown in FIG. 3, and a pressure inlet path 74 of the upper casing 66 is communicated with the electro-pneumatic converter 60. The dedicated controller 61 selects a polishing solution supply rate, and the converter 60 supplies pilot air at a pressure according to the selected supply rate to the pressure adjustment valve 54. In this system, a cleaning fluid pipe 64 having a shutoff valve 62 is merged with the liquid path between the shutoff valve 52 and the pressure adjustment valve 54.

Accordingly, by constantly circulating the polishing solution inside the piping for delivering the solution to the polishing section 4, changes in concentration due to stagnation in the pipes and line plugging due to precipitated solid substances can be eliminated. Also, because the arrangement permits the use of a long length of piping for the supply source, one polishing solution supply source (mixing section) 18 can be used to supply polishing solution, in a stable condition, to a plurality of polishing sections 4. The cost of the overall facility can thus be reduced, as explained above.

The operation of the polishing solution supply system of such a construction will be explained. The controller controls the operation of the circulation pump 46 in such a manner that the outlet-side pressure is always higher than a specific value so as to establish a constant flow of the polishing solution within the circulation path 2.

When a polishing section 4 is started, a respective controller 61 outputs an open-valve signal to each shutoff valve 52, and at the same time outputs a flow command signal corresponding to a pre-selected polishing solution flow rate to the electro-pneumatic converter 60. The converter 60 delivers a pilot air pressure corresponding to the flow command signal to the air pressure chamber 76 of the pressure adjustment valve 54, thereby opening the space between the valve body 90 and the valve seat 88. In the pressure adjustment valve 54, the solution entering through the solution inlet path 78 passes through primary valve chamber 80 and the opening between the valve body 90 and valve seat 88, and flows into the liquid pressure chamber 82. The pressure inside the liquid pressure chamber 82 is univocally determined by the flow rate of the solution flowing through the orifice 29. Therefore, by controlling the pressure inside the liquid pressure chamber 82 at a given value, the flow rate of the solution is controlled at a desired value.

The solution flowing out of the liquid outlet path 84 can be maintained at a constant flow rate by controlling the pressure in the liquid pressure chamber 82 in the same manner as explained in a description of the previous embodiment.

Also, to change the level of flow rates of the polishing solution, flow resistance in the orifice 56 located downstream of the pressure adjustment valve 54 is changed as explained in a description of the previous embodiment. To change the flow resistance of orifice 56, the size of the hole in the orifice should be changed.

When the liquid level in the buffer tube 18 becomes lower than the lower limit, the controller opens the shutoff valve 26 according to the signal from the level sensor 40c, thereby the stock solution and deionized water under the control of pressure adjustment valve 28 flow at a given constant ratio and are mixed in the buffer tube 18.

When one of the polishing sections 4 is stopped, the shutoff valve 52 in its delivery pipe 24 is closed. This raises the fluid pressure in the circulation pipe 20 temporarily, but in the delivery pipes 24 of the remaining polishing sections 4, each pressure adjustment valve 54 maintains the fluid pressure of the solution in the secondary-side to maintain a constant flow of solution, in spite of pressure changes in the primary-side.

When polishing is to be resumed, the shutoff valve 62 in the cleaning fluid pipe 64 is opened and the interior of the delivery pipe 24 is cleaned. This controls plugging in the line caused by stagnant solution or changes in concentration of the polishing solution.

Figure 7:
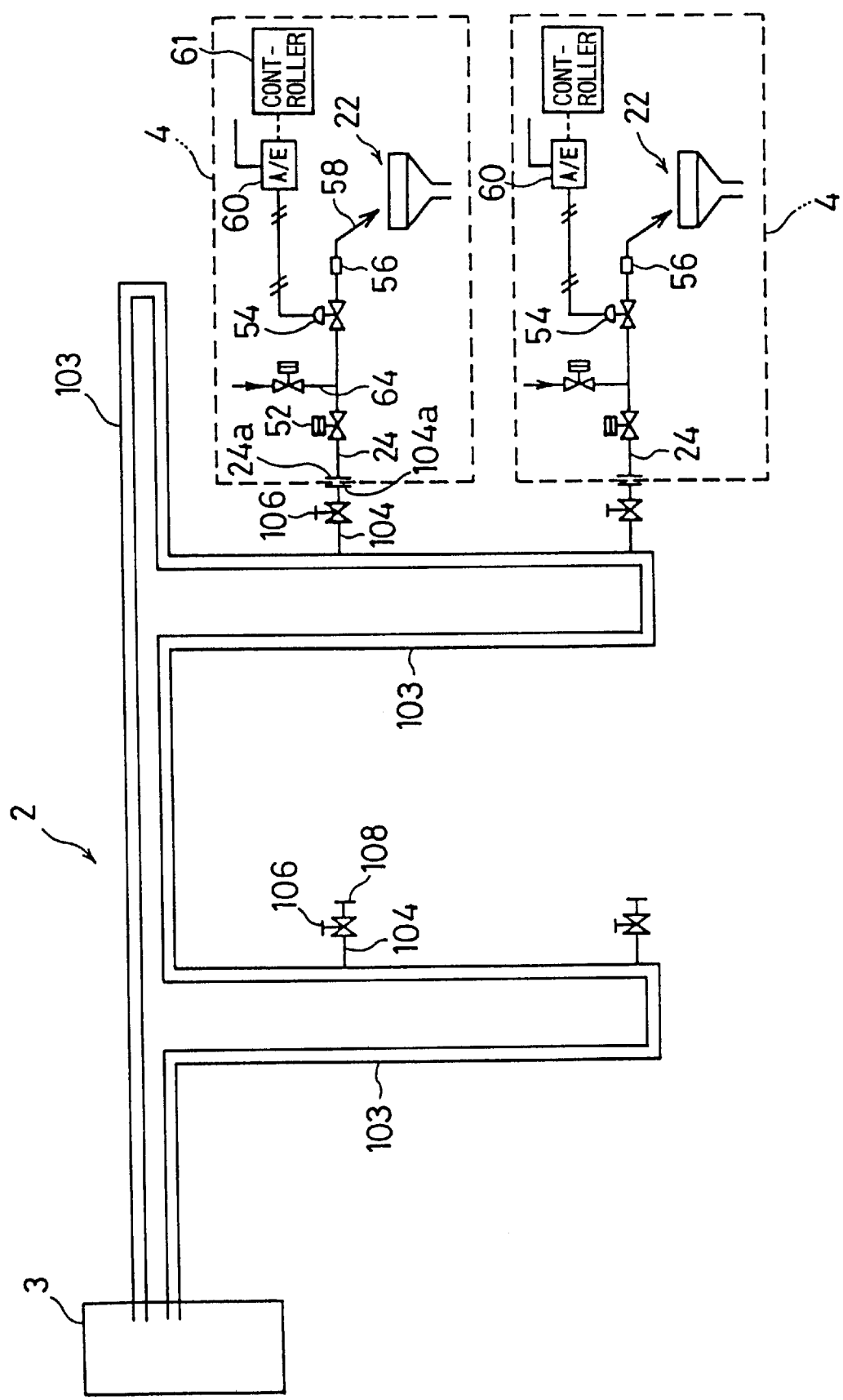
FIG. 7 is a schematic layout of a variation of the second embodiment of the polishing system of the present invention.

FIG. 7 shows a variation of the second embodiment shown in FIG. 6, and more specifically shows the layout of the circulation path 2 inside a plant and the polishing sections 4. In this case, circulation path 2 comprises a trunk line 103 connected to a polishing solution supply source 3, and includes branch lines 104 (each having a shutoff valve 106 and a coupling flange 104a). In this case, the flange 24a of the delivery pipe 24 of each polishing section 4 is connected through the coupling flange 104a. Shutoff valve 106 is necessary for each branch line 104 when it is desired to incorporate a new polishing section 4, without shutting down the operation of the polishing system. When installing a trunk line 103 in a plant, a number of branch line 104, each having a shutoff valve 106, should be pre-installed to facilitate installation of new polishing sections to the system.

This type of arrangement of the circulation path 2 allows the trunk line 103 to be placed close to each polishing section 4 so that the delivery pipes 24 which are susceptible to stagnation of polishing solution can be further shortened, thereby achieving the primary objective of supplying a polishing solution of a stable concentration to all the polishing sections. FIG. 7 shows two of the four branch lines 104 in a standby state.

Figure 8:
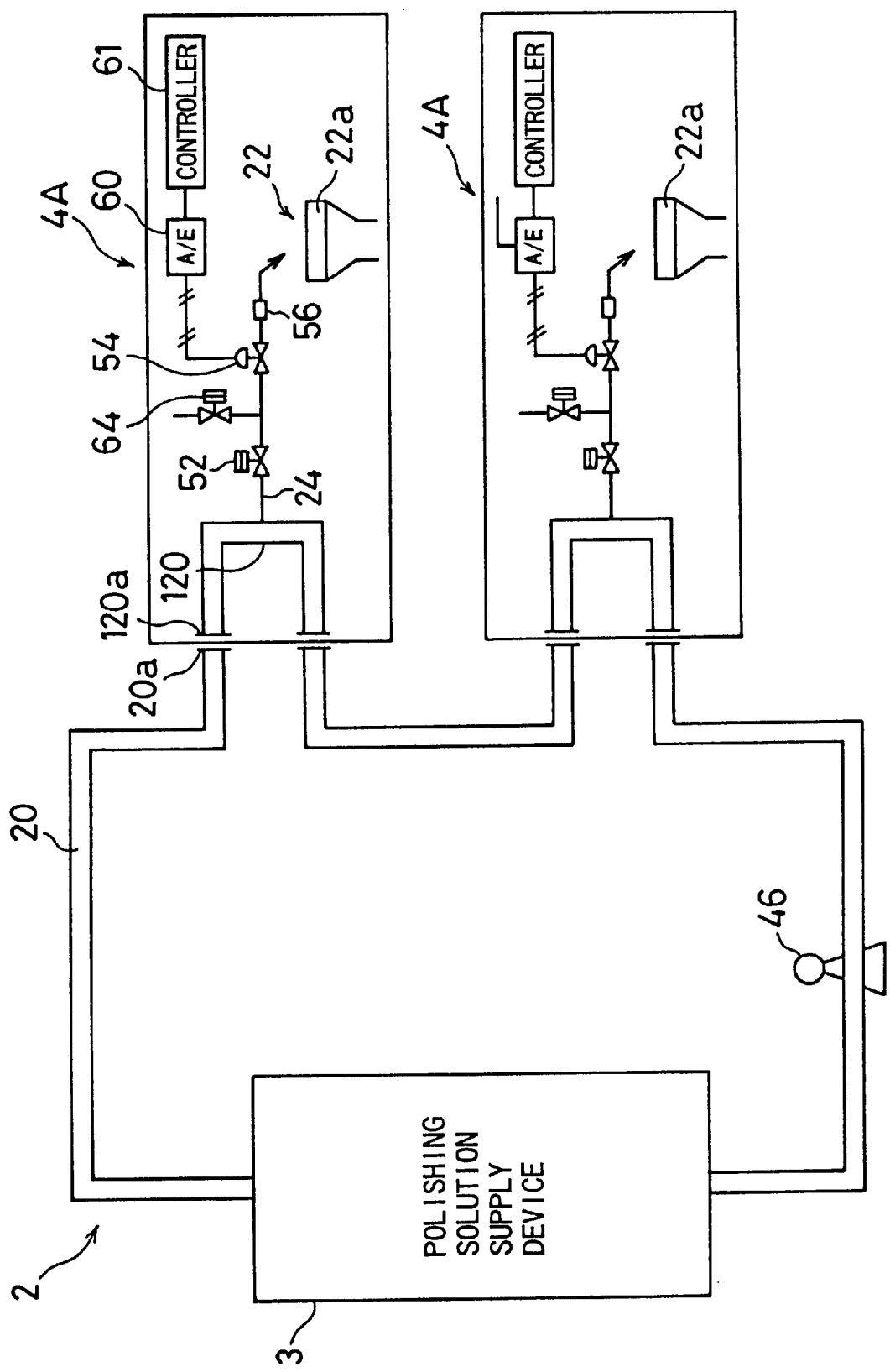
FIG. 8 is a schematic layout of a third embodiment of the polishing system of the present invention.

FIG. 8 shows a third embodiment of the polishing system. In this case, a portion of the circulation path 2 extends to flow circulating polishing solution into polishing section 4A through an extended circulation pipe 120. Flanges 120a of the extended pipe 120 connect to flanges 20a of the circulation pipe 20 to circulate the solution, and a delivery pipe 24 is disposed at the end of the extended circulation pipe 120 to deliver the solution to each polishing section 4A. As in the previous embodiments, the delivery pipe 24 is provided with a pressure adjustment valve 54 as a flow rate control means and a shutoff valve 52 as a flow stopping means.

In this embodiment, the circulation path 2 extends into the polishing section 4A to shorten the length of the delivery pipe 24 even further, thereby shortening pipes that are vulnerable to precipitation and plugging which can be caused by temporary shutdown of the polishing section 4A, so as to provide even more stable polishing operation.

In the above embodiment, the polishing sections are unitized to include delivery pipes 24 and control devices, but it is obvious that a polishing section can be comprised by an assembly of separate components. Also, a plurality of polishing operations can be performed by providing separate polishing solution sources 3 for each polishing section 4A so as to supply a plurality of polishing compounds and solutions.

What is claimed is:

1. A polishing system comprising:
   a polishing section for pressing an object to be polished against a polishing tool;
   a delivery line to communicate with an external polishing solution supply source for delivering a polishing solution to said polishing section;
   a flow control device for controlling flow of the polishing solution within said delivery line at a desired flow rate within a range of flow rates in response to a command signal; and
   a shutoff valve for stopping the flow of the polishing solution within said delivery line,
   wherein said delivery line comprises a circulation line in which the polishing solution can always flow, and a delivery pipe extending directly from said circulation line toward said polishing section.

2. A system as claimed in claim 1, further comprising a trunk line to communicate with the external polishing solution supply source, wherein said circulation line constitutes a portion of said trunk line.

3. A polishing system comprising:
   a polishing section for pressing an object to be polished against a polishing tool;
   a delivery line to communicate with an external polishing solution supply source for delivering a polishing solution to said polishing section;
   a flow control device for controlling flow of the polishing solution within said delivery line at a desired flow rate in response to a command signal; and
   a shutoff valve for stopping the flow of the polishing solution within said delivery line,
   wherein said flow control device includes a pressure adjustment valve for adjusting a pressure at a downstream side of said flow control device to a specific value determined by said command signal.

4. A system as claimed in claim 3, wherein said flow control device further includes a constriction device provided at a downstream side of said pressure adjustment valve.

5. A system as claimed in claim 1, further comprising a cleaning liquid delivery pipe for delivering a cleaning solution to said flow control device.

6. A system as claimed in claim 1, further comprising a housing enclosing said polishing section and said delivery line.

7. A polishing system comprising:
   a polishing section for pressing an object to be polished against a polishing tool;
   an external polishing solution supply source;
   a delivery line communicating with said external polishing solution supply source for delivering a polishing solution to said polishing section;
   a flow control device for controlling flow of the polishing solution within said delivery line at a desired flow rate within a range of flow rates in response to a command signal; and
   a shutoff valve for stopping the flow of the polishing solution within said delivery line,
   wherein said delivery line comprises an extended circulation line in which the polishing solution can always flow and a delivery pipe extending directly from said extended circulation line toward said polishing section.

8. A system as claimed in claim 7, further comprising a trunk line to communicate with said external polishing solution supply source, wherein said extended circulation line constitutes a portion of said trunk line.

9. A system as claimed in claim 7, a polishing system comprising:
   a polishing section for pressing an object to be polished against a polishing tool;
   an external polishing solution supply source;
   a delivery line to communicate with said external polishing solution supply source for delivering a polishing solution to said polishing section;
   a flow control device for controlling flow of the polishing solution within said delivery line at a desired flow rate in response to a command signal; and
   a shutoff valve for stopping the flow of the polishing solution within said delivery line,
   wherein said flow control device includes a pressure adjustment valve for adjusting a pressure at a downstream side of said flow control device to a specific value determined by said command signal.

10. A system as claimed in claim 9, wherein said flow control device further includes a constriction device provided at a downstream side of said pressure adjustment valve.

11. A system as claimed in claim 7, further comprising a cleaning liquid delivery pipe for delivering a cleaning solution to said flow control device.

12. A system as claimed in claim 7, further comprising a housing enclosing said polishing section and said delivery line.

13. A polishing system comprising:
   a polishing solution supply system for preparing a polishing solution;
   a plurality of polishing sections for polishing an object; by pressing said object against a polishing tool, wherein each of said polishing sections includes a delivery line for communicating with said polishing solution supply system and delivering polishing solution to said respective polishing section; and
   a circulation pipe communicating with said polishing solution supply system and said delivery lines of said polishing sections, wherein said circulation pipe is adapted to circulate only unused polishing solution therein.

14. A polishing system as claimed in claim 13, wherein each of said delivery lines includes a flow control device for controlling the flow of the polishing solution.

15. A polishing system as claimed in claim 13, wherein each of said delivery lines includes a pressure adjustment device for adjusting a pressure of the polishing solution in said respective polishing section.

16. A polishing system as claimed in claim 13, wherein said polishing solution supply system comprises a mechanism for controlling a concentration of the polishing solution.

17. A polishing system as claimed in claim 13, wherein said polishing solution supply system is operable to mix a stock solution and a dilution solution.

18. A polishing system as claimed in claim 13, wherein each of said delivery lines is connectable to a cleaning fluid pipe.

19. A polishing system as claimed in claim 13, wherein said circulation pipe has connecting portions that are connectable to said delivery lines for supplying the polishing solution to one of said polishing sections.

20. A polishing system as claimed in claim 13, wherein said recirculating pipe includes a plurality of branch lines connected to said delivery lines, respectively, and a plurality of shutoff valves disposed in said branch lines, respectively.

* * * * *